(12) United States Patent
Chen et al.

(10) Patent No.: US 12,322,739 B2
(45) Date of Patent: Jun. 3, 2025

(54) DISPLAY APPARATUS

(71) Applicant: Au Optronics Corporation, Hsinchu (TW)

(72) Inventors: Yea-Ching Chen, Hsinchu (TW); Ming-Chun Hsu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 523 days.

(21) Appl. No.: 17/827,806

(22) Filed: May 30, 2022

(65) Prior Publication Data
US 2023/0253379 A1    Aug. 10, 2023

(30) Foreign Application Priority Data
Feb. 10, 2022    (TW) .................. 111104871

(51) Int. Cl.
*H10H 20/85* (2025.01)
*H01L 25/13* (2006.01)
*H10H 20/857* (2025.01)

(52) U.S. Cl.
CPC ......... *H01L 25/13* (2013.01); *H10H 20/8506* (2025.01); *H10H 20/857* (2025.01)

(58) Field of Classification Search
CPC ............. H01L 33/62; H01L 33/00–648; H01L 27/15–156; H01L 2933/00–0091; H10H 29/00–49; H10H 20/85–8586
See application file for complete search history.

(56) References Cited

U.S. PATENT DOCUMENTS

| | | | |
|---|---|---|---|
| 2014/0103375 A1* | 4/2014 | Kobayakawa | H01L 23/31 438/26 |
| 2020/0251457 A1* | 8/2020 | Huang | H01L 25/0753 |
| 2022/0051989 A1* | 2/2022 | Agarwal | H01L 25/0655 |
| 2022/0077226 A1* | 3/2022 | Chang | H01L 25/0753 |

* cited by examiner

*Primary Examiner* — Eric A. Ward
*Assistant Examiner* — Nora T. Nix
(74) *Attorney, Agent, or Firm* — JCIPRNET

(57) ABSTRACT

A display apparatus includes circuit boards and display units. The display unit includes a circuit substrate, a first light emitting device, and second light emitting devices. The circuit substrate has a first wire bonding pad and second wire bonding pads. A first electrode disposed on one side of a first light emitting structure layer of the first light emitting device is wire-bonded to one second wire bonding pad, and a second electrode disposed on the other side of the first light emitting structure layer is bonded to the first wire bonding pad. Third and fourth electrodes disposed on one side of a second light emitting structure layer of the second light emitting device are respectively wire-bonded to two of the first wire bonding pad and the second wire bonding pads. The first wire bonding pad overlaps the first light emitting device and at least one second light emitting device.

9 Claims, 8 Drawing Sheets

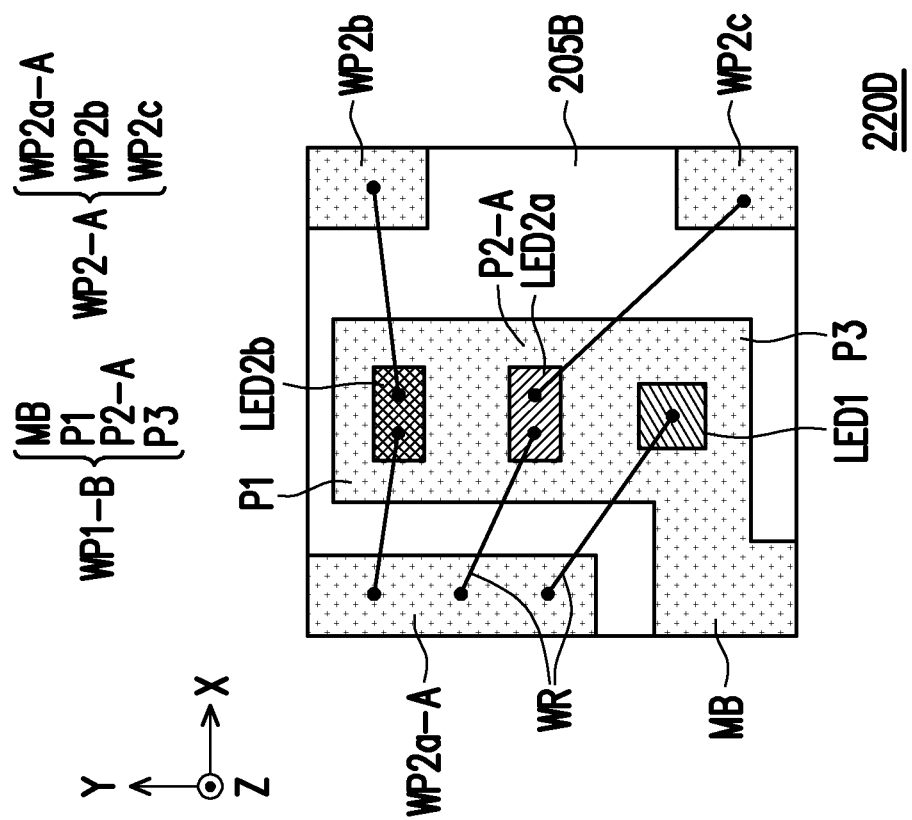
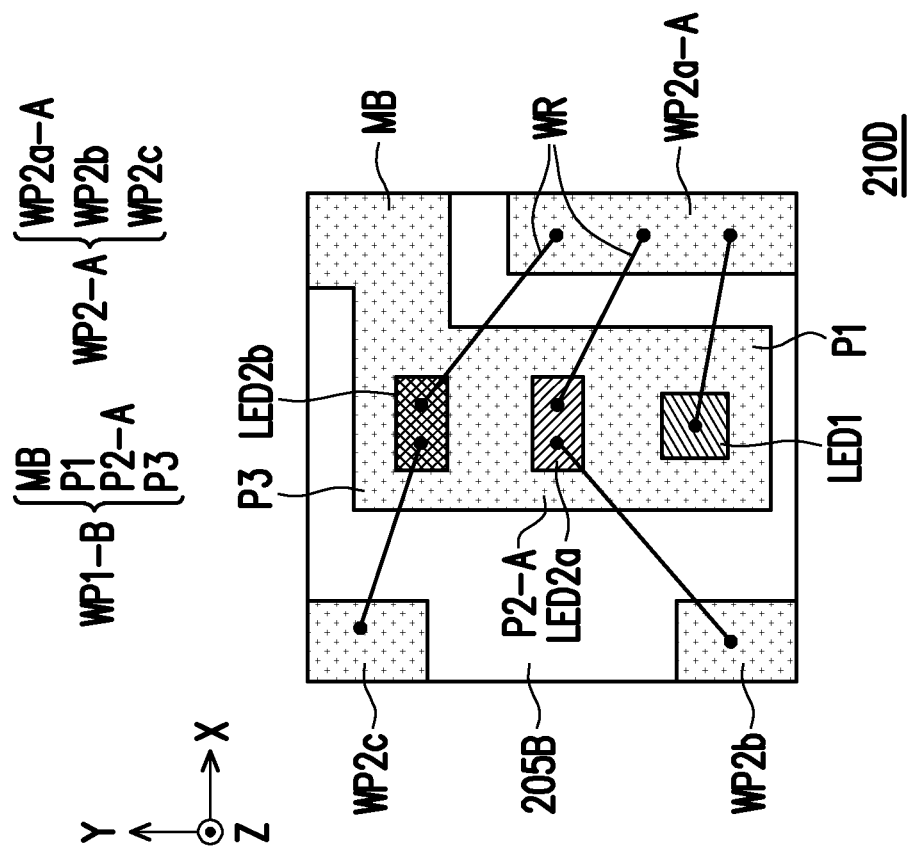
FIG. 7B
FIG. 7A

DISPLAY APPARATUS

CROSS-REFERENCE TO RELATED APPLICATION

This application claims the priority benefit of Taiwan application serial no. 111104871, filed on Feb. 10, 2022. The entirety of the above-mentioned patent application is hereby incorporated by reference herein and made a part of this specification.

BACKGROUND

Technical Field

The disclosure relates to a display apparatus, and more particularly, to a tiled display apparatus.

Related Art

With gradual diversification of the applications of display apparatuses, the use of large display panels for displaying public information or advertisements in major exhibition venues or department stores has become increasingly common. To reduce the cost of installation and maintenance of large display panels, a tiled display apparatus formed by tiling multiple display panels has become one of the common installation methods for such large display panels. To be tiled into different contours, the outer contour patterns of component panels divided from the tiled display apparatus are bound to increase. Taking a light-emitting diode panel as an example, the sizes of the circuit backplanes and the types of circuit design are bound to increase to satisfy different tiling pattern requirements. However, the increase in the types of circuit design of the circuit backplanes tends to lengthen the development time of the product, and the labor cost also increases.

SUMMARY

The disclosure provides a display apparatus with lower manufacturing cost and better tiled display effect.

A display apparatus according to the disclosure has a non-rectangular display area and includes a plurality of circuit boards and a plurality of display units. Each of the circuit boards has a plurality of bonding pads located in the non-rectangular display area. The display units are respectively bonded to the bonding pads and are electrically connected to the circuit boards. Each of the display units includes a circuit substrate, a first light emitting device, and a plurality of second light emitting devices. The circuit substrate has a surface facing away from the circuit boards, and a first wire bonding pad and a plurality of second wire bonding pads disposed on the surface. The first light emitting device is disposed on the surface of the circuit substrate and has a first light emitting structure layer, a first electrode, and a second electrode. The first electrode is disposed on a side of the first light emitting structure layer away from the circuit substrate and is wire-bonded to one of the second wire bonding pads. The second electrode is disposed between the first light emitting structure layer and the circuit substrate and is bonded to the first wire bonding pad. The second light emitting devices are disposed on the surface of the circuit substrate and each have a second light emitting structure layer, a third electrode, and a fourth electrode. The third electrode and the fourth electrode are disposed on a side of the second light emitting structure layer away from the circuit substrate and are respectively wire-bonded to two of the first wire bonding pad and the second wire bonding pads. The first wire bonding pad overlaps the first light emitting device and at least one of the second light emitting devices.

Based on the above, in an embodiment of the disclosure, the display apparatus formed by tiling a plurality of circuit boards has a non-rectangular display area, and each display unit bonded in the non-rectangular display area is provided with two different types of light emitting devices, i.e., a vertical-type first light emitting device and a lateral-type second light emitting device. In the display unit, the first wire bonding pad of the circuit substrate is arranged to overlap the first light emitting device and at least one second light emitting device. Therefore, the interchangeability of the arrangement positions of the first light emitting device and the second light emitting device can be increased, and further the variety of circuit designs of the circuit boards bonded with the display units can be reduced, and the tiled display effect of the display apparatus can be simultaneously ensured.

BRIEF DESCRIPTION OF THE DRAWINGS

FIG. 7A and FIG. 7B are schematic enlarged views of two display units in different half-regions of a display apparatus according to a third embodiment of the disclosure.

DESCRIPTION OF THE EMBODIMENTS

Figure 1:
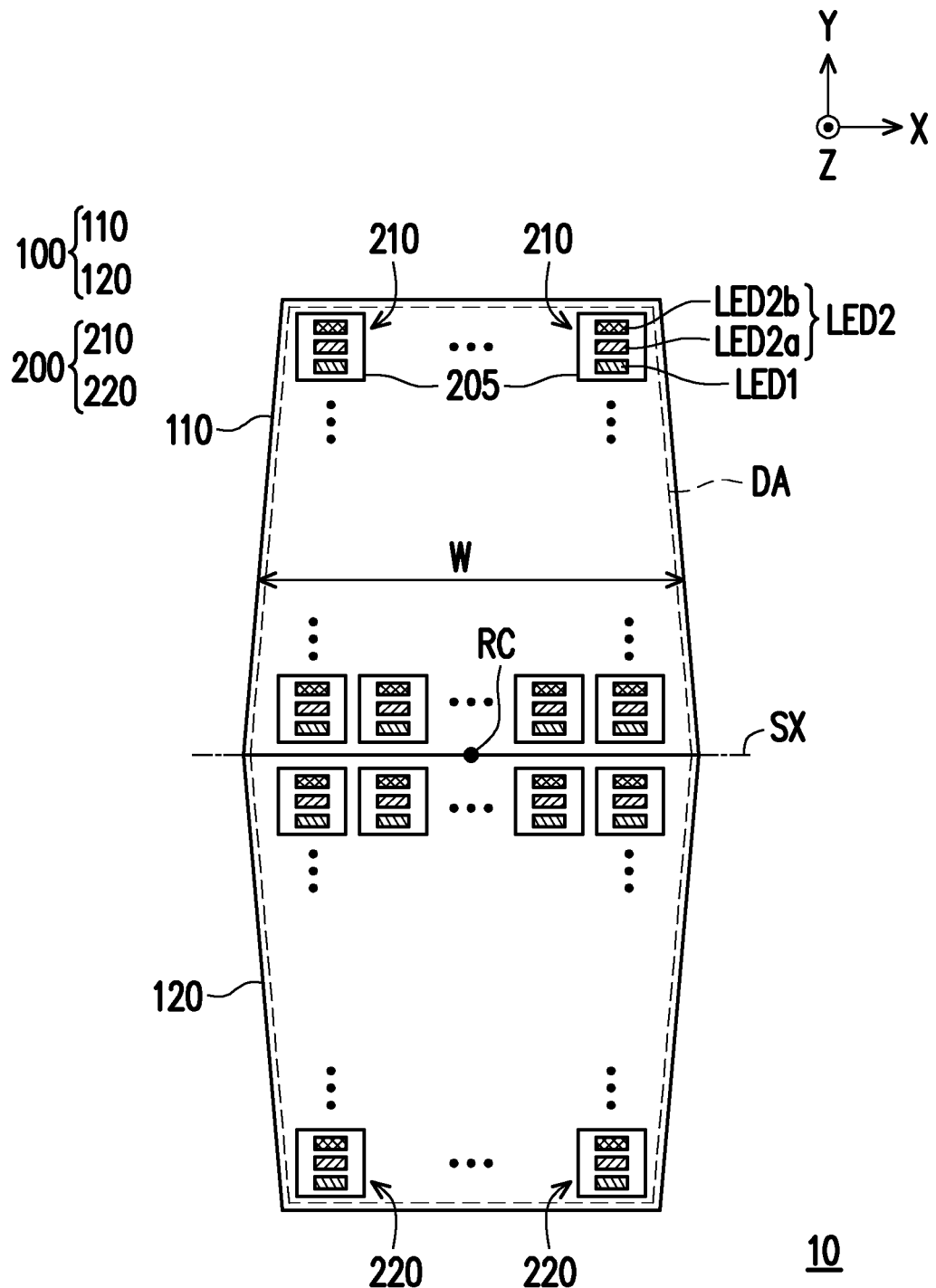
FIG. 1 is a schematic top view of a display apparatus according to a first embodiment of the disclosure.

The term "about," "approximately," or "substantially" as used herein is inclusive of the stated value and a mean within an acceptable range of deviation for the particular value as determined by people having ordinary skill in the art, considering the measurement in question and the error associated with measurement of the particular quantity (i.e., the limitations of the measurement system). For example, "about" may mean within one or more standard deviations, for example, ±30%, ±20%, ±15%, ±10%, or ±5% of the stated value. Moreover, a relatively acceptable range of deviation or standard deviation may be chosen for the term "about," "approximately," or "substantially" as used herein based on measurement properties, cutting properties, or other properties, instead of applying one standard deviation across all the properties.

In the accompanying drawings, thicknesses of layers, films, panels, regions, etc. are exaggerated for clarity. It should be understood that when a device such as a layer, film, region, or substrate is referred to as being "on" or "connected to" another device, it may be directly on or connected to another device, or intervening devices may also be present. In contrast, when a device is referred to as being "directly on" or "directly connected to" another device, there are no intervening devices present. As used herein, the term "connected" may refer to physical connection and/or electrical connection. Besides, if two devices are "electrically connected", it is possible that other devices are present between these two devices.

Moreover, relative terms such as "below" or "bottom" and "above" or "top" may serve to describe the relation between one component and another component herein as shown in the drawings. It should also be understood that the relative terms are intended to include different orientations of a device in addition to the orientation shown in the drawings. For example, if a device in the drawings is turned upside down, a component described as being "below" another component shall be re-orientated to be "above" the another component. Thus, the exemplary term "below" may include the orientations of "below" and "above", depending on the specific orientation of the drawings. Similarly, if a device in the drawings is turned upside down, a component described to be "under" or "below" another component shall be re-oriented to be "above" the another component. Therefore, the exemplary term "on" or "under" may include orientations of "above" and "below".

Exemplary embodiments will be described herein with reference to schematic cross-sectional views illustrating idealized embodiments. Hence, variations of shapes resulting from manufacturing technologies and/or tolerances, for instance, are to be expected. The embodiments described herein should not be construed as being limited to the particular shapes of regions as illustrated herein but are to include deviations in shapes that result, for example, from manufacturing. For instance, regions shown or described as being flat may typically have rough and/or non-linear features. Besides, the acute angle as shown may be round. That is, the regions shown in the drawings are schematic in nature, and their shapes are not intended to show the exact shapes of the regions, and are not intended to limit the scope of the claims.

Reference will now be made in detail to exemplary embodiments provided in the disclosure, examples of which are illustrated in accompanying drawings. Wherever possible, identical reference signs will be used in the drawings and descriptions to refer to identical or similar parts.

Figure 2:
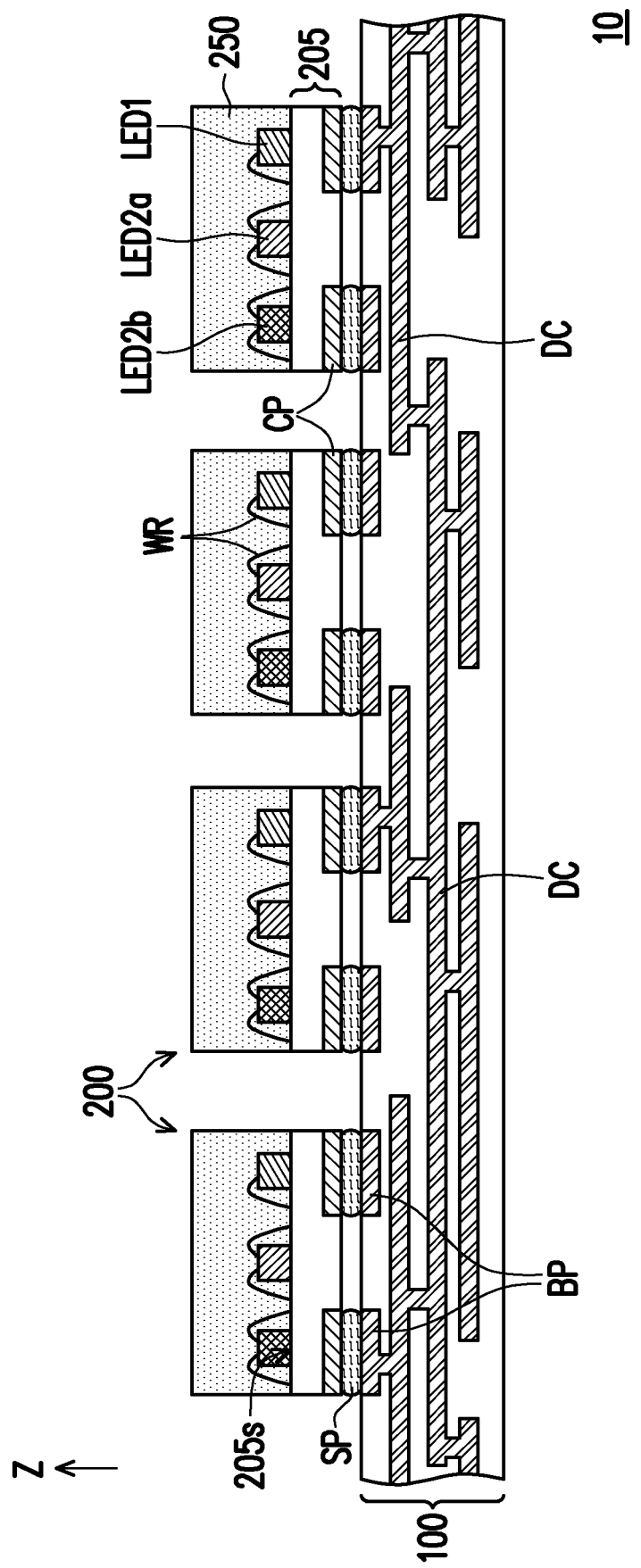
FIG. 2 is a schematic cross-sectional view of the display apparatus of FIG. 1.
Figure 3A:
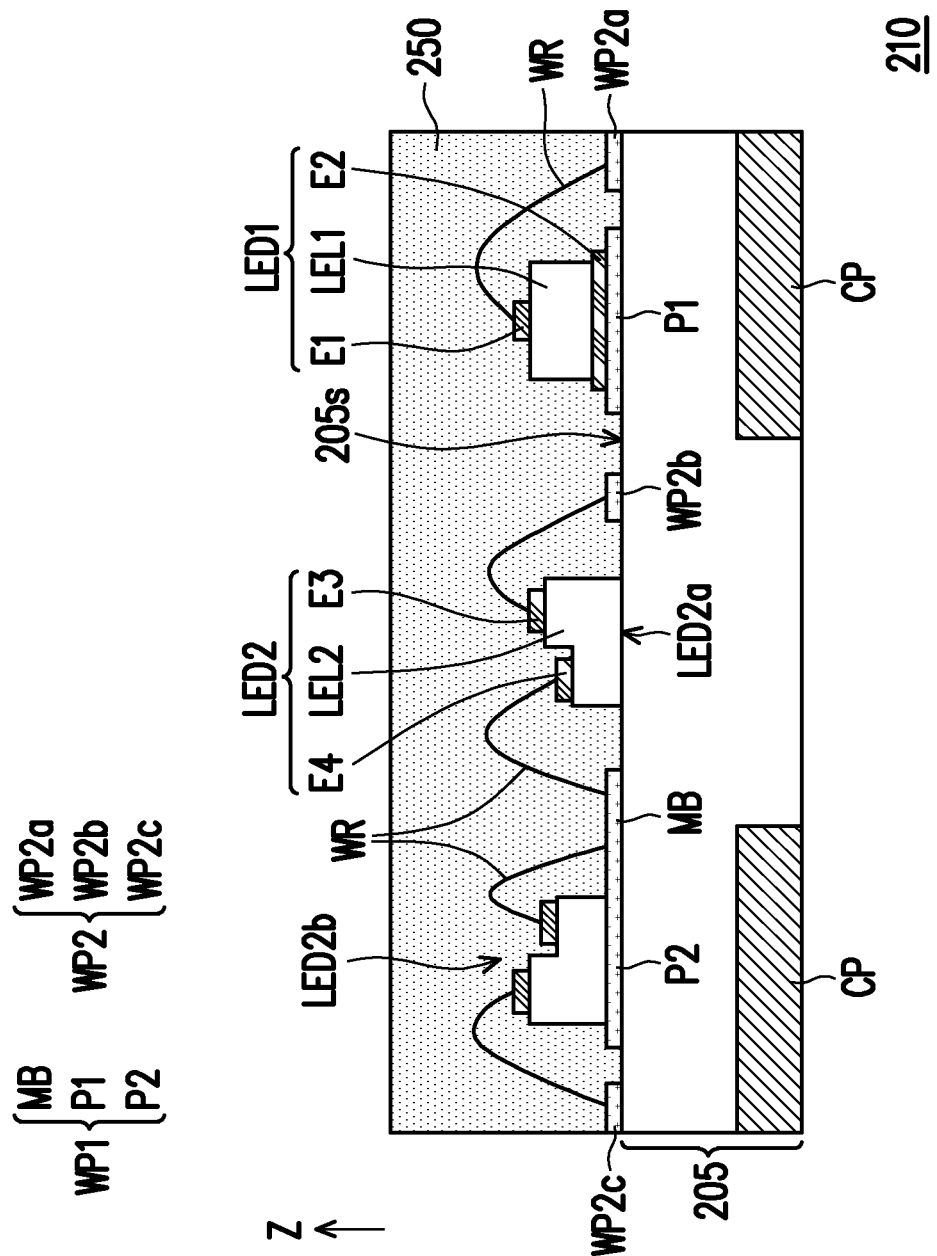
FIG. 3A and FIG. 3B are schematic cross-sectional views of two display units respectively bonded on two circuit boards in FIG. 1.
Figure 3B:
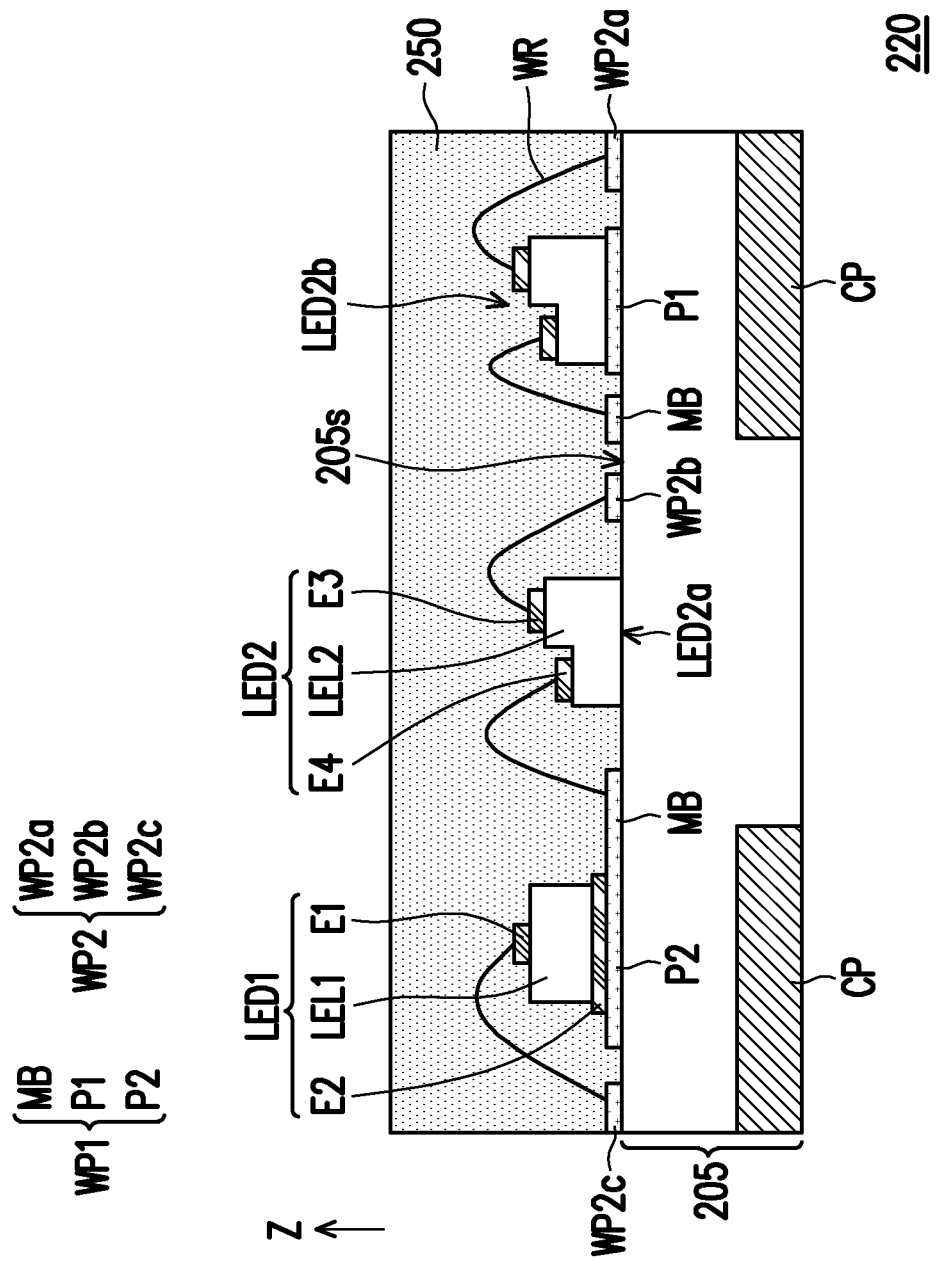
Figure 4B:
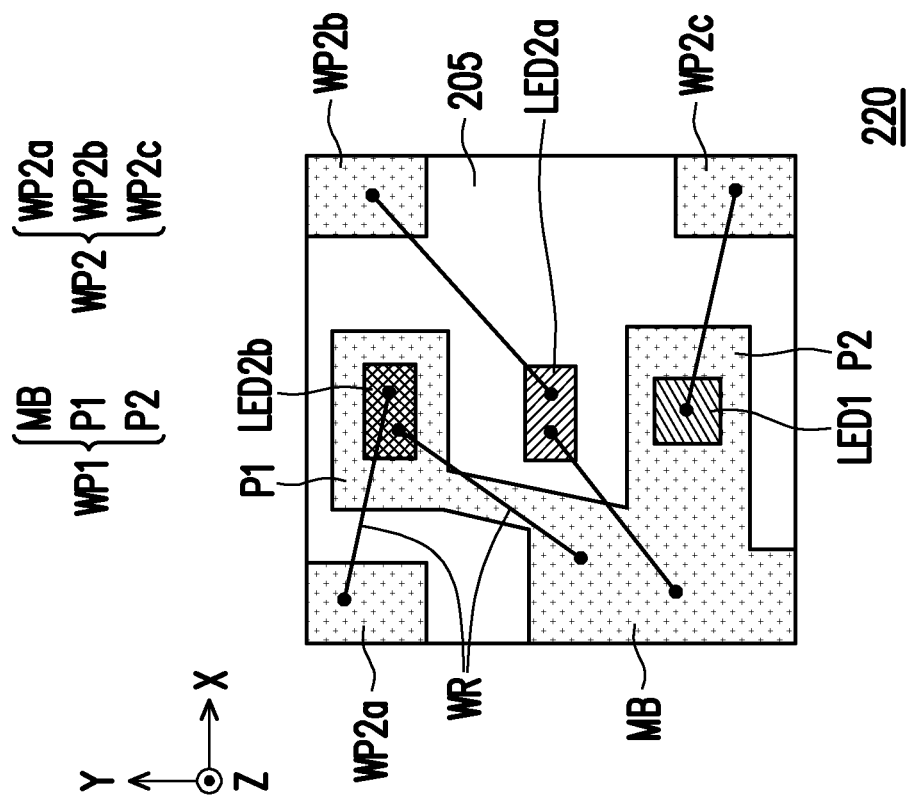
FIG. 4A and FIG. 4B are schematic enlarged views of two display units in different half-regions of the display apparatus of FIG. 1.
Figure 4A:
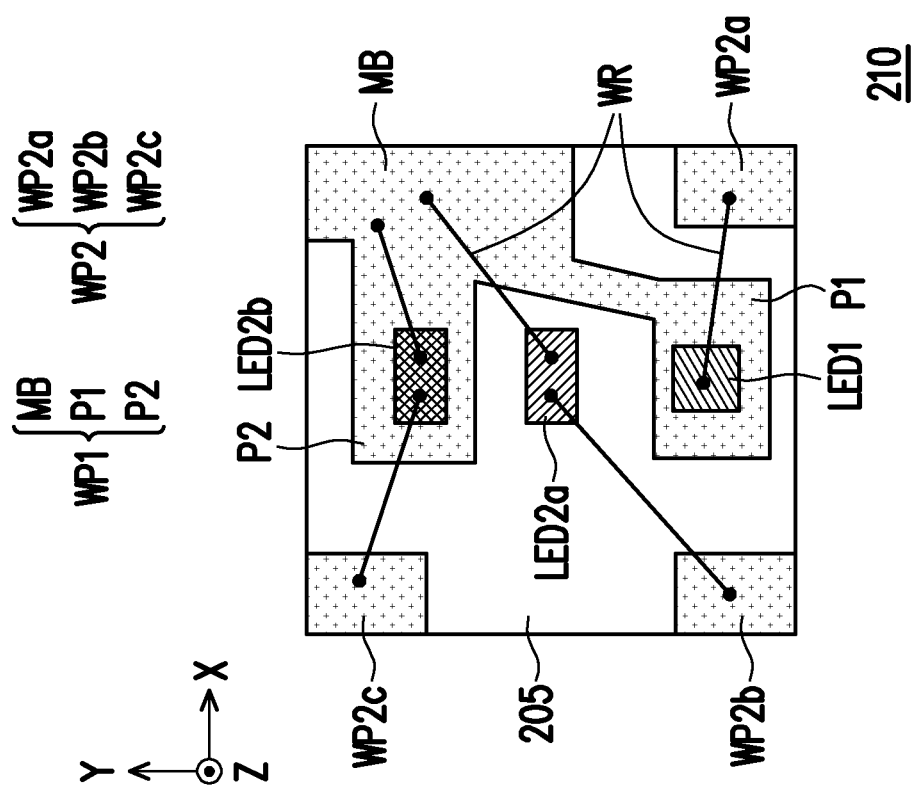

FIG. 1 is a schematic top view of a display apparatus according to a first embodiment of the disclosure. FIG. 2 is a schematic cross-sectional view of the display apparatus of FIG. 1. FIG. 3A and FIG. 3B are schematic cross-sectional views of two display units respectively bonded on two circuit boards in FIG. 1. FIG. 4A and FIG. 4B are schematic enlarged views of two display units in different half-regions of the display apparatus of FIG. 1. Referring to FIGS. 1 to FIG. 3B, a display apparatus 10 includes a plurality of circuit boards 100 and a plurality of display units 200 disposed on the circuit boards 100. In this embodiment, the display apparatus 10 is a tiled display formed by tiling a circuit board 110 and a circuit board 120, and has a non-rectangular display area DA. However, the disclosure is not limited thereto. In other embodiments, the number of circuit boards of the display apparatus may be adjusted according to the actual size or shape requirements.

In this embodiment, a surface of the circuit board 100 may be provided with a plurality of bonding pads BP, and the circuit board 100 may have a driving circuit DC. The bonding pads BP may be electrically connected to different parts of the driving circuit DC to perform individual electrical operations. On the other hand, the bonding pads BP may be configured to bond a plurality of display units 200. The display units 200 may be electrically connected to the circuit board 100 through bonding with the bonding pads BP.

Specifically, the display unit 200 may include a circuit substrate 205 and a first light emitting device LED1 and a second light emitting device LED2 disposed on a surface 205s of the circuit substrate 205 on a side away from the circuit board 100. In this embodiment, the first light emitting device LED1 is, for example, a vertical-type light emitting device, and the second light emitting device LED2 is, for example, a lateral-type light emitting device. For example, the first light emitting device LED1 has a light emitting structure layer LEL1, an electrode E1, and an electrode E2. The electrode E1 is disposed on a side of the light emitting structure layer LEL1 away from the circuit substrate 205, and the electrode E2 is disposed between the light emitting structure layer LEL1 and the circuit substrate 205. The second light emitting device LED2 has a light emitting structure layer LEL2, and an electrode E3 and an electrode E4 disposed on a side of the light emitting structure layer LEL2 away from the circuit substrate 205.

In this embodiment, the surface 205s of the circuit substrate 205 is provided with a first wire bonding pad WP1 and a plurality of second wire bonding pads WP2. The electrode E2 of the first light emitting device LED1 may be electrically connected to the first wire bonding pad WP1 through, for example, thermal bonding with a silver paste, the electrode E4 of the second light emitting device LED2 may be electrically connected to the first wire bonding pad WP1 through wire bonding, and the electrode E1 of the first light emitting device LED1 and the electrode E3 of the second light emitting device LED2 may be electrically connected to the second wire bonding pad WP2 through wire bonding. Herein, wire bonding refers to, for example, bridge-connecting the electrode of the light emitting device with the wire bonding pad by using a metal wire WR (e.g., a gold wire).

In this embodiment, the numbers of the first light emitting device LED1 and the second light emitting device LED2 of the display unit 200 are respectively one and two (e.g., a second light emitting device LED2a and a second light emitting device LED2b), and the first light emitting device LED1, the second light emitting device LED2a, and the second light emitting device LED2b are respectively configured to display different colors, such as red, green, and blue, but are not limited thereto. In other embodiments, the numbers and emitted light color combinations of the first light emitting device LED1 and the second light emitting device LED2 on the display unit 200 may be adjusted according to the actual requirements.

To protect the light emitting devices and the metal wires WR, the display unit 200 may further include an encapsulation layer 250 covering the light emitting devices, the wire bonding pads, and the metal wires WR. On the other hand, to realize electrical connection between the display unit 200 and the circuit board 100, the display unit 200 may further include a plurality of conductive patterns CP provided on a side facing the circuit board 100, and the conductive patterns CP may be respectively bonded with a plurality of bonding pads BP on the circuit board 100 through a plurality of solder patterns SP. Specifically, the plurality of wire bonding pads of the display unit 200 may be electrically connected to the conductive patterns CP through an internal circuit of the circuit substrate 205, and further electrically connected to the driving circuit DC of the circuit board 100.

The conductive pattern CP may be implemented by a pin structure commonly used in a chip package and is not specifically limited in the disclosure. For example, the package structure of the display unit 200 may be a plastic leaded chip carrier (PLCC), a molding package structure, or another suitable package structure. In particular, the display unit of the disclosure may be a package structure of a single pixel (e.g., a combination of the first light emitting device LED1, the second light emitting device LED2a, and the second light emitting device LED2b), or a multi-pixel package structure, and is not specifically limited in the disclosure.

On the other hand, the outer contour of the circuit board 100 of this embodiment in a plan view direction (e.g., in the direction Z) is not a rectangle but is, for example, an isosceles trapezoid. For example, the non-rectangular display area DA of the display apparatus 10 has a symmetry axis SX at the tiling position between the two circuit boards 100, and the outer contours of the circuit board 110 and the circuit board 120 are symmetrically configured about the symmetry axis SX. For example, the circuit board 100 has a width W along the axial direction (e.g., the direction X) of the symmetry axis SX, and the width W decreases toward a direction (e.g., the direction Y or the reverse of the direction Y) away from the symmetry axis SX, but the disclosure is not limited thereto. In other embodiments, the width of the circuit board may also increase toward a direction away from the symmetry axis SX or satisfy width variations of other contour requirements. From another perspective, the non-rectangular display area DA further has a rotational symmetry center RC, and the circuit board 110 is rotationally symmetric to the circuit board 120 at 180 degrees about the rotational symmetry center RC.

More specifically, the circuit board 110 and the circuit board 120 tiled to form the display apparatus 10 may share the same circuit design. When the display apparatus of the disclosure requires tiling more circuit boards due to size or shape requirements, by configuring multiple circuit boards that have a similar or same size and shape but are arranged in different orientations or positions to have the same circuit design, it is possible to effectively reduce the types of circuit design of the circuit boards, which helps shorten the development time of the product and save the cost of development labor.

To ensure the tiled display effect of the display apparatus while reducing the types of circuit design of the circuit boards, the design of the wire bonding pads of the display unit 200 in this embodiment may be commonly applied to display units on different circuit boards.

Referring to FIG. 4A and FIG. 4B at the same time, for example, in this embodiment, the plurality of display units 200 of the display apparatus 10 may be divided into a plurality of display units 210 bonded on the circuit board 110 and a plurality of display units 220 bonded on the circuit board 120. Since the circuit board 110 constituting the upper half of the non-rectangular display area DA and the circuit board 120 constituting the lower half of the non-rectangular display area DA have rotational symmetry at 180 degrees, the wire bonding pads on the display unit 210 and the display unit 220 respectively bonded to the circuit board 110 and the circuit board 120 also exhibit rotational symmetry at 180 degrees.

Since the circuit board 120 is arranged to be rotated 180 degrees with respect to the circuit board 110, the arrangement sequence of the first light emitting device LED1, the second light emitting device LED2a, and the second light emitting device LED2b that are on the display unit 220 bonded with the circuit board 120 and are configured to emit lights of different colors should be the same as the arrangement sequence of the first light emitting device LED1, the second light emitting device LED2a, and the second light emitting device LED2b on the display unit 210 bonded with the circuit board 110, so as to avoid occurrence of dark lines or bright lines at the tiling position between the two circuit boards and thus affecting the tiled display quality. Therefore, the arrangement relationship between the wire bonding pads and the light emitting devices on the display unit 210 should be different from the arrangement relationship between the wire bonding pads and the light emitting devices on the display unit 220.

That is, when the circuit board 120 is rotated, the arrangement positions of at least a part of the light emitting devices of the display unit 220 on the circuit board 120 may be reversed to form the same arrangement sequence of the plurality of light emitting devices on the display unit 210. To satisfy this requirement and enable the display unit 210 on the circuit board 110 and the display unit 220 on the circuit board 120 to share the circuit substrate 205, the first wire bonding pad WP1 on the display unit 200 should overlap the first light emitting device LED1 and at least one second light emitting device LED2 (e.g., the second light emitting device LED2b) along the normal direction (e.g., the direction Z) of the surface 205s of the circuit substrate 205. However, the second light emitting device LED2a does not overlap the first wire bonding pad WP1 along the direction Z, but is not limited thereto.

Specifically, the first wire bonding pad WP1 of the display unit 200 may have a main body part MB, and a first portion P1 and a second portion P2 extending from the main body part MB and separated from each other. The first portion P1 is located between the rotational symmetry center RC and the second portion P2. In this embodiment, the first light emitting device LED1 of the display unit 210 is electrically bonded to the first portion P1 of the first wire bonding pad WP1 of the display unit 210, and the second light emitting device LED2b of the display unit 210 overlaps the second portion P2 of the first wire bonding pad WP1 of the display unit 210 along the direction Z. The first light emitting device LED1 of the display unit 220 is electrically bonded to the second portion P2 of the first wire bonding pad WP1 of the display unit 220, and the second light emitting device LED2b of the display unit 220 overlaps the first portion P1 of the first wire bonding pad WP1 of the display unit 220 along the direction Z.

Further, in the display unit 210 (as shown in FIG. 3A and FIG. 4A), the electrode E1 of the first light emitting device LED1 is wire-bonded to the second wire bonding pad WP2a, and the electrode E2 of the first light emitting device LED1 is thermally bonded to the first portion P1 of the first wire bonding pad WP1. The electrode E3 of the second light emitting device LED2a is wire-bonded to the second wire bonding pad WP2b, and the electrode E4 of the second light emitting device LED2a is wire-bonded to the main body part MB of the first wire bonding pad WP1. The electrode E3 of the second light emitting device LED2b is wire-bonded to the second wire bonding pad WP2c, and the electrode E4 of the second light emitting device LED2b is wire-bonded to the main body part MB of the first wire bonding pad WP1.

However, different from the display unit 210, in the display unit 220 (as shown in FIG. 3B and FIG. 4B), the electrode E1 of the first light emitting device LED1 is wire-bonded to the second wire bonding pad WP2c, and the electrode E2 of the first light emitting device LED1 is thermally bonded to the second portion P2 of the first wire bonding pad WP1. The electrode E3 of the second light emitting device LED2b is wire-bonded to the second wire bonding pad WP2a, and the electrode E4 of the second light emitting device LED2b is wire-bonded to the main body part MB of the first wire bonding pad WP1.

That is, through the overlap between the first wire bonding pad WP1 and the first light emitting device LED1 and the second light emitting device LED2b, the arrangement flexibility of the two light emitting devices can be increased, and further the display unit 210 and the display unit 220 respectively bonded to the circuit board 110 and the circuit board 120 which have rotational symmetry at 180 degrees can share the circuit substrate 205 of the same circuit design. In addition, the interchangeability of the arrangement positions of the two light emitting devices can also allow the light emitting devices of all the display units 200 bonded on the circuit board 110 and the circuit board 120 to have the same arrangement sequence to ensure the tiled display effect of the display apparatus 10.

In this embodiment, the electrode E1 and the electrode E2 of the first light emitting device LED1 may be respectively electrically connected to a P-type semiconductor layer (not shown) and an N-type semiconductor layer (not shown) of the light emitting structure layer LEL1, and the electrode E3 and the electrode E4 of the second light emitting device LED2 may be respectively electrically connected to a P-type semiconductor layer (not shown) and an N-type semiconductor layer (not shown) of the light emitting structure layer LEL2. That is, the electrode E1 of the first light emitting device LED1 and the electrode E3 of the second light emitting device LED2 may be anodes (or P-type electrodes) having a positive potential, and the electrode E2 of the first light emitting device LED1 and the electrode E4 of the second light emitting device LED2 may be cathodes (or N-type electrodes) having a negative potential, but the disclosure is not limited thereto.

From another perspective, the first wire bonding pad WP1 in this embodiment may be a common cathode bonding pad which electrically connects the electrode E2 of the first light emitting device LED1, the electrode E4 of the second light emitting device LED2a, and the electrode E4 of the second light emitting device LED2b, and the second wire bonding pad WP2a, the second wire bonding pad WP2b, and the second wire bonding pad WP2c are respectively three anode bonding pads which electrically connect the electrode E1 of the first light emitting device LED1, the electrode E3 of the second light emitting device LED2a, and the electrode E3 of the second light emitting device LED2b and may be individually controlled.

Other embodiments will be provided below to describe the disclosure in detail. The same components will be labeled with the same reference signs, and descriptions of the same technical contents will be omitted. Reference may be made to the above embodiments for the omitted descriptions, which will not be repeated below.

Figure 5B:
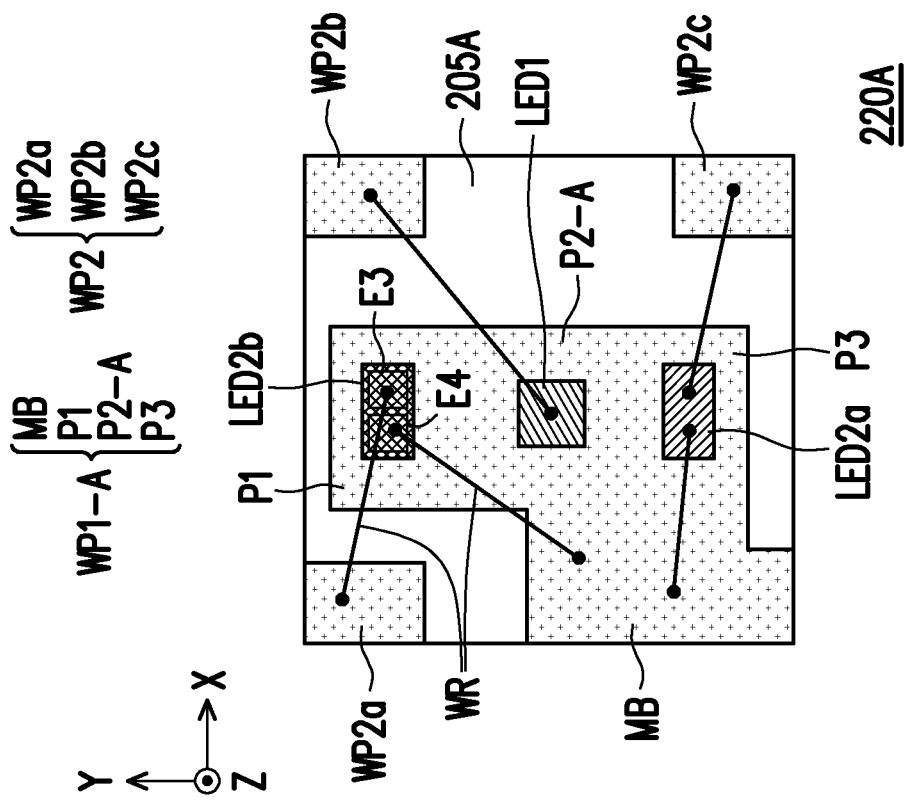
FIG. 5A and FIG. 5B are schematic enlarged views of two display units in different half-regions of a display apparatus according to a second embodiment of the disclosure.
Figure 5A:
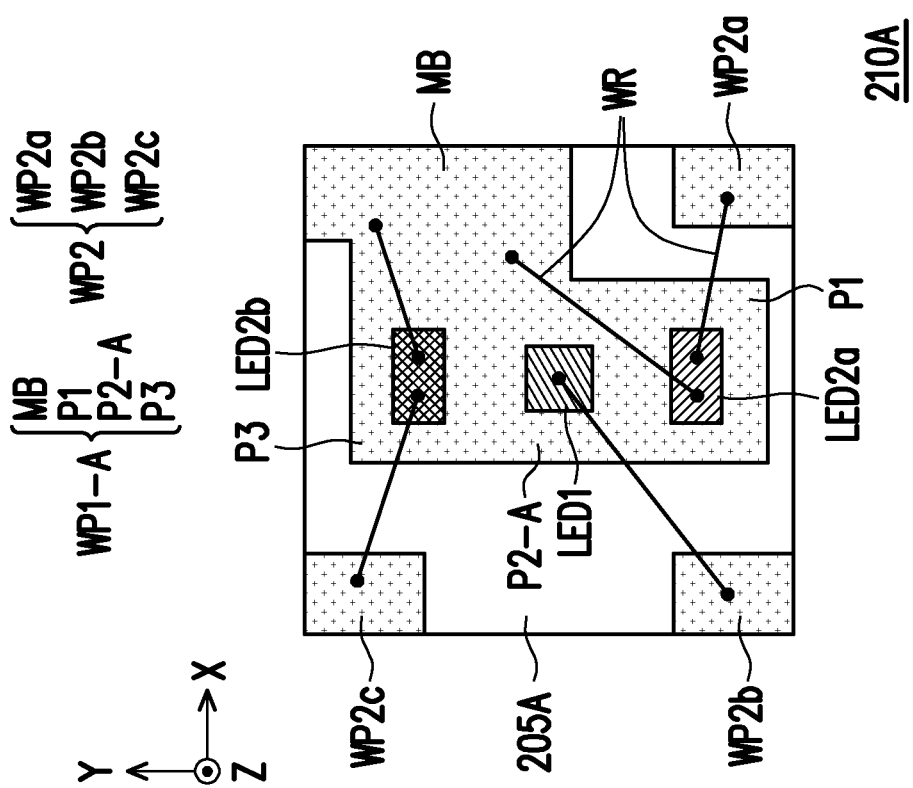
Figure 6B:
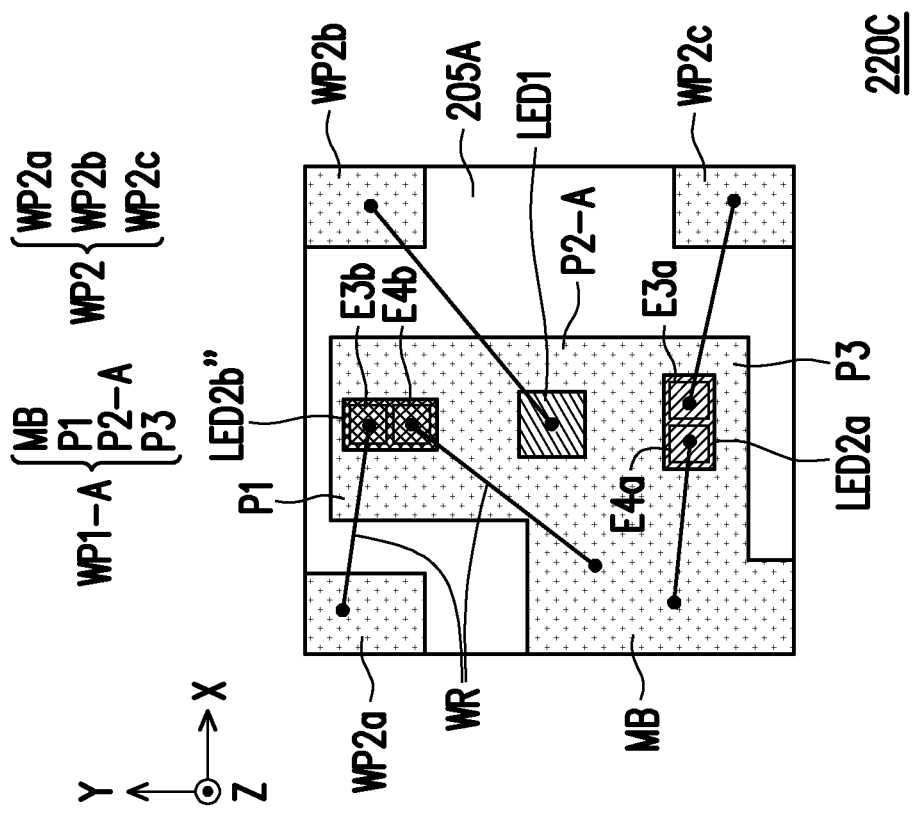
FIG. 6A and FIG. 6B are schematic enlarged views of a display unit according to other modification embodiments of FIG. 5B.
Figure 6A:
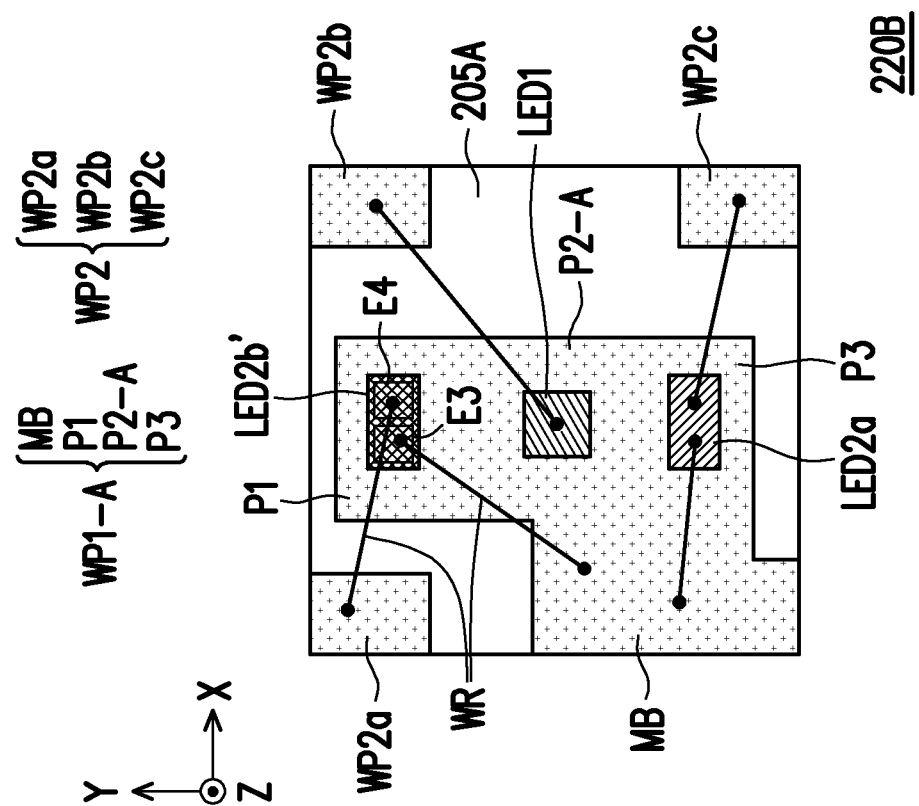

FIG. 5A and FIG. 5B are schematic enlarged views of two display units in different half-regions of a display apparatus according to a second embodiment of the disclosure. FIG. 6A and FIG. 6B are schematic enlarged views of a display unit according to other modification embodiments of FIG. 5B. Referring to FIG. 5A and FIG. 5B, different from the display unit 210 and the display unit 220 of FIG. 4A and FIG. 4B, in display units of this embodiment, such as a display unit 210A in FIG. 5A and a display unit 220A in FIG. 5B, a first wire bonding pad WP1-A overlaps all the light emitting devices along the direction Z. Since the arrangement of the two circuit boards of the display apparatus of this embodiment is similar to that of the display apparatus 10 of FIG. 1, reference may be made to the relevant paragraphs and corresponding drawings of the above embodiment for detailed descriptions, which will not be repeated herein.

In this embodiment, the first wire bonding pad WP1-A may have a main body part MB, and a first portion P1, a second portion P2-A, and a third portion P3 extending from the main body part MB and connected to each other. The first portion P1 is located between the rotational symmetry center RC (shown in FIG. 1) and the second portion P2-A, and the second portion P2-A is located between the first portion P1 and the third portion P3. For example, in this embodiment, whether it is the display unit 210A bonded on the circuit board 110 of FIG. 1 or the display unit 220A bonded on the circuit board 120 of FIG. 1, the first light emitting device LED1 is both disposed on, and is electrically connected to, the second portion P2-A of the first wire bonding pad WP1-A. However, the arrangement relationship between the two second light emitting devices LED2 and an overlapping circuit substrate 205A in the display unit 210A is different from the arrangement relationship between the two second light emitting devices LED2 and the overlapping circuit substrate 205A in the display unit 220A.

For example, in the display unit 210A, the second light emitting device LED2a and the second light emitting device LED2b configured to display different colors (e.g., blue and green) respectively overlap the first portion P1 and the third portion P3 of the first wire bonding pad WP1-A along the direction Z. The two electrodes (e.g., the electrode E3 and the electrode E4 in FIG. 3A) of the second light emitting device LED2a may be respectively wire-bonded to the second wire bonding pad WP2a and the main body part MB of the first wire bonding pad WP1-A. The two electrodes of the second light emitting device LED2b may be respectively wire-bonded to the second wire bonding pad WP2c and the main body part MB of the first wire bonding pad WP1-A.

In contrast, in the display unit 220A, the second light emitting device LED2a and the second light emitting device LED2b configured to display different colors respectively overlap the third portion P3 and the first portion P1 of the first wire bonding pad WP1-A along the direction Z. The two electrodes (e.g., the electrode E3 and the electrode E4 in FIG. 3A) of the second light emitting device LED2a may be respectively wire-bonded to the second wire bonding pad WP2c and the main body part MB of the first wire bonding pad WP1-A. The two electrodes of the second light emitting device LED2b may be respectively wire-bonded to the second wire bonding pad WP2a and the main body part MB of the first wire bonding pad WP1-A.

Through the overlap between the first wire bonding pad WP1-A and all the light emitting devices, the arrangement flexibility of the light emitting devices on the display unit can be further increased, and further the display unit 210A and the display unit 220A respectively bonded to the two circuit boards (as shown in FIG. 1) having rotational symmetry at 180 degrees can share the circuit substrate 205A of the same circuit design. In addition, the interchangeability of the arrangement positions of the light emitting devices also allows the light emitting devices of all display units (e.g., the display unit 210A of FIG. 5A and the display unit 220A of FIG. 5B) bonded to the two circuit boards to have the same arrangement sequence to ensure the display effect of the tiled display apparatus.

To increase the wire bonding yield of the second light emitting device, in some modification embodiments, the arrangement relationship between the two electrodes of the second light emitting device and the corresponding two wire bonding pads may also be configured in a manner different from that shown in FIG. 5A and FIG. 5B. For example, in a display unit 220B of FIG. 6A, the arrangement of the electrode E3 and the electrode E4 of a second light emitting device LED2b' is opposite to the arrangement of the electrode E3 and the electrode E4 of the second light emitting device LED2b of FIG. 5B. Alternatively, in a display unit 220C as shown in FIG. 6B, the arrangement direction (e.g., the direction Y) of an electrode E3b and an electrode E4b of a second light emitting device LED2b" is different from (e.g., perpendicular to) the arrangement direction (e.g., the direction X) of the two electrodes E3 and E4 of the second light emitting device LED2b in FIG. 5B. That is, in the display unit 220C of FIG. 6B, the arrangement direction of an electrode E3a and an electrode E4a of the second light emitting device LED2a configured to display a first color (e.g., green) may be different from the arrangement direction of the electrode E3b and the electrode E4b of the second light emitting device LED2b" configured to display a second color (e.g., blue).

FIG. 7A and FIG. 7B are schematic enlarged views of two display units in different half-regions of a display apparatus according to a third embodiment of the disclosure. Referring to FIG. 7A and FIG. 7B, the main difference between display units of this embodiment and the display units of FIG. 5A and FIG. 5B lies in that the connection relationship between the wire bonding pads and the light emitting devices is different, and the arrangement sequence of the light emitting devices configured to display different colors is different.

Different from the display unit 210A of FIG. 5A and the display unit 220A of FIG. 5B, in this embodiment, the first light emitting device LED1 and the second light emitting device LED2a of a display unit 210D respectively overlap the first portion P1 and the second portion P2-A of a first wire bonding pad WP1-B along the direction Z, and the first light emitting device LED1 and the second light emitting device LED2a of a display unit 220D respectively overlap the third portion P3 and the second portion P2-A of the first wire bonding pad WP1-B along the direction Z.

On the other hand, a second wire bonding pad WP2a-A of this embodiment may be a common anode bonding pad of the first light emitting device LED1, the second light emitting device LED2a, and the second light emitting device LED2b, and the first wire bonding pad WP1-B, the second wire bonding pad WP2b, and the second wire bonding pad WP2c are respectively three cathode bonding pads which electrically connect the first light emitting device LED1, the second light emitting device LED2a, and the second light emitting device LED2b and may be individually controlled.

Specifically, in the display unit 210D of FIG. 7A, the two electrodes of the second light emitting device LED2a may be respectively wire-bonded to the second wire bonding pad WP2b and the second wire bonding pad WP2a-A. The two electrodes of the second light emitting device LED2b may be respectively wire-bonded to the second wire bonding pad WP2c and the second wire bonding pad WP2a-A. A P-type electrode (not shown) of the first light emitting device LED1 may be wire-bonded to the second wire bonding pad WP2a-A, and an N-type electrode (not shown) of the first light emitting device LED1 may be thermally bonded to the first portion P1 of the first wire bonding pad WP1-B.

In the display unit 220D of FIG. 7B, the two electrodes of the second light emitting device LED2a may be respectively wire-bonded to the second wire bonding pad WP2c and the second wire bonding pad WP2a-A. The two electrodes of the second light emitting device LED2b may be respectively wire-bonded to the second wire bonding pad WP2b and the second wire bonding pad WP2a-A. A P-type electrode (not shown) of the first light emitting device LED1 may be wire-bonded to the second wire bonding pad WP2a-A, and an N-type electrode (not shown) of the first light emitting device LED1 may be thermally bonded to the third portion P3 of the first wire bonding pad WP1-B.

Although the connection relationship between the light emitting devices and the wire bonding pads of the display units of this embodiment is different from that of the display units shown in FIG. 5A and FIG. 5B, overlap is still present between the first wire bonding pad WP1-B and all the light emitting devices. Therefore, the arrangement flexibility of the light emitting devices can be increased, and further the display unit 210D and the display unit 220D respectively bonded to the two circuit boards having rotational symmetry can share a circuit substrate 205B of the same circuit design. In other words, the development cost of the circuit board and the circuit substrate of the tiled display apparatus can be effectively reduced.

In summary of the above, in an embodiment of the disclosure, the display apparatus formed by tiling a plurality of circuit boards has a non-rectangular display area, and each display unit bonded in the non-rectangular display area is provided with two different types of light emitting devices, i.e., a vertical-type first light emitting device and a lateral-type second light emitting device. In the display unit, the first wire bonding pad of the circuit substrate is arranged to overlap the first light emitting device and at least one second light emitting device. Therefore, the interchangeability of the arrangement positions of the first light emitting device and the second light emitting device can be increased, and further the variety of circuit designs of the circuit boards bonded with the display units can be reduced, and the tiled display effect of the display apparatus can be simultaneously ensured.

What is claimed is:

1. A display apparatus having a non-rectangular display area, and comprising:
    a plurality of circuit boards, each having a plurality of bonding pads located in the non-rectangular display area; and
    a plurality of display units respectively bonded to the bonding pads and electrically connected to the circuit boards, each of the display units comprising:
    a circuit substrate having a surface facing away from the circuit boards, and a first wire bonding pad and a plurality of second wire bonding pads disposed on the surface;
    a first light emitting device disposed on the surface of the circuit substrate and having a first light emitting structure layer, a first electrode, and a second electrode, wherein the first electrode is disposed on a side of the first light emitting structure layer away from the circuit substrate and is wire-bonded to one of the second wire bonding pads, and the second electrode is disposed between the first light emitting structure layer and the circuit substrate and is bonded to the first wire bonding pad; and
    a plurality of second light emitting devices disposed on the surface of the circuit substrate and each having a second light emitting structure layer, a third electrode, and a fourth electrode, wherein the third electrode and the fourth electrode are disposed on a side of the second light emitting structure layer away from the circuit substrate and are respectively wire-bonded to two of the first wire bonding pad and the second wire bonding pads,
    wherein the first wire bonding pad overlaps the first light emitting device and at least one of the second light emitting devices, the non-rectangular display area has a rotational symmetry center, the circuit boards comprise a first circuit board and a second circuit board, the first circuit board is rotationally symmetric to the second circuit board at 180 degrees about the rotational symmetry center, the first wire bonding pad comprises a main body part, and a first portion and a second portion extending from the main body part and separated from each other, the first portion is located between the rotational symmetry center and the second portion, and the second light emitting devices are wire-bonded to the main body part of the first wire bonding pad.

2. The display apparatus according to claim 1, wherein the non-rectangular display area further has a symmetry axis passing through the rotational symmetry center, each of the circuit boards has a width along an axial direction of the symmetry axis, and the width decreases or increases toward a direction away from the symmetry axis.

3. The display apparatus according to claim 1, wherein the display units comprise a first display unit bonded to the first circuit board and a second display unit bonded to the second circuit board, the first light emitting device of the first display unit is electrically bonded to the first portion of the first wire bonding pad of the first display unit, the at least one of the second light emitting devices of the first display unit overlaps the second portion of the first wire bonding pad of the first display unit, the first light emitting device of the second display unit is electrically bonded to the second portion of the first wire bonding pad of the second display unit, and the at least one of the second light emitting devices of the second display unit overlaps the first portion of the first wire bonding pad of the second display unit.

4. The display apparatus according to claim 1, wherein the third electrode and the fourth electrode of each of the second light emitting devices are respectively wire-bonded to the first wire bonding pad and one of the second wire bonding pads.

5. The display apparatus according to claim 1, wherein an emitted light color of the first light emitting device is red, and an emitted light color of each of the second light emitting devices is blue or green.

6. A display apparatus having a non-rectangular display area, and comprising:
a plurality of circuit boards, each having a plurality of bonding pads located in the non-rectangular display area; and
a plurality of display units respectively bonded to the bonding pads and electrically connected to the circuit boards, each of the display units comprising:
a circuit substrate having a surface facing away from the circuit boards, and a first wire bonding pad and a plurality of second wire bonding pads disposed on the surface;
a first light emitting device disposed on the surface of the circuit substrate and having a first light emitting structure layer, a first electrode, and a second electrode, wherein the first electrode is disposed on a side of the first light emitting structure layer away from the circuit substrate and is wire-bonded to one of the second wire bonding pads, and the second electrode is disposed between the first light emitting structure layer and the circuit substrate and is bonded to the first wire bonding pad; and
a plurality of second light emitting devices disposed on the surface of the circuit substrate and each having a second light emitting structure layer, a third electrode, and a fourth electrode, wherein the third electrode and the fourth electrode are disposed on a side of the second light emitting structure layer away from the circuit substrate and are respectively wire-bonded to two of the first wire bonding pad and the second wire bonding pads, wherein the first wire bonding pad overlaps the first light emitting device and at least one of the second light emitting devices, the non-rectangular display area has a rotational symmetry center, the circuit boards comprise a first circuit board and a second circuit board, the first circuit board is rotationally symmetric to the second circuit board at 180 degrees about the rotational symmetry center, the first wire bonding pad comprises a main body part, and a first portion, a second portion, and a third portion extending from the main body part and connected to each other, the first portion is located between the rotational symmetry center and the second portion, the second portion is located between the first portion and the third portion, and the second light emitting devices are wire-bonded to the main body part of the first wire bonding pad.

7. The display apparatus according to claim 6, wherein the display units comprise a first display unit bonded to the first circuit board and a second display unit bonded to the second circuit board, the first light emitting device of the first display unit is electrically bonded to the second portion of the first wire bonding pad of the first display unit, one of the second light emitting devices that is configured to display a first color in the first display unit overlaps the first portion of the first wire bonding pad of the first display unit, another of the second light emitting devices that is configured to display a second color in the first display unit overlaps the third portion of the first wire bonding pad of the first display unit, the first light emitting device of the second display unit is electrically bonded to the second portion of the first wire bonding pad of the second display unit, one of the second light emitting devices that is configured to display the first color in the second display unit overlaps the third portion of the first wire bonding pad of the second display unit, and another of the second light emitting devices that is configured to display the second color in the second display unit overlaps the first portion of the first wire bonding pad of the second display unit.

8. A display apparatus having a non-rectangular display area, and comprising:
a plurality of circuit boards, each having a plurality of bonding pads located in the non-rectangular display area; and
a plurality of display units respectively bonded to the bonding pads and electrically connected to the circuit boards, each of the display units comprising:
a circuit substrate having a surface facing away from the circuit boards, and a first wire bonding pad and a plurality of second wire bonding pads disposed on the surface;
a first light emitting device disposed on the surface of the circuit substrate and having a first light emitting structure layer, a first electrode, and a second electrode, wherein the first electrode is disposed on a side of the first light emitting structure layer away from the circuit substrate and is wire-bonded to one of the second wire bonding pads, and the second electrode is disposed between the first light emitting structure layer and the circuit substrate and is bonded to the first wire bonding pad; and a plurality of second light emitting devices disposed on the surface of the circuit substrate and each having a second light emitting structure layer, a third electrode, and a fourth electrode, wherein the third electrode and the fourth electrode are disposed on a side of the second light emitting structure layer away from the circuit substrate and are respectively wire-bonded to two of the first wire bonding pad and the second wire bonding pads, wherein the first wire bonding pad overlaps the first light emitting device and at least one of the second light emitting devices, and an arrangement direction of the third electrode and the fourth electrode of one of the second light emitting devices that is configured to display a first color is different from an arrangement direction of the third electrode and the fourth electrode of another of the second light emitting devices that is configured to display a second color.

9. A display apparatus having a non-rectangular display area, and comprising:
- a plurality of circuit boards, each having a plurality of bonding pads located in the non-rectangular display area; and
- a plurality of display units respectively bonded to the bonding pads and electrically connected to the circuit boards, each of the display units comprising:
- a circuit substrate having a surface facing away from the circuit boards, and a first wire bonding pad and a plurality of second wire bonding pads disposed on the surface;
- a first light emitting device disposed on the surface of the circuit substrate and having a first light emitting structure layer, a first electrode, and a second electrode, wherein the first electrode is disposed on a side of the first light emitting structure layer away from the circuit substrate and is wire-bonded to one of the second wire bonding pads, and the second electrode is disposed between the first light emitting structure layer and the circuit substrate and is bonded to the first wire bonding pad; and
- a plurality of second light emitting devices disposed on the surface of the circuit substrate and each having a second light emitting structure layer, a third electrode, and a fourth electrode, wherein the third electrode and the fourth electrode are disposed on a side of the second light emitting structure layer away from the circuit substrate and are respectively wire-bonded to two of the first wire bonding pad and the second wire bonding pads, wherein the first wire bonding pad overlaps the first light emitting device and at least one of the second light emitting devices, and the third electrode and the fourth electrode of each of the second light emitting devices are respectively wire-bonded to two of the second wire bonding pads.

\* \* \* \* \*